(12) United States Patent
Berger et al.

(10) Patent No.: US 10,347,314 B2
(45) Date of Patent: *Jul. 9, 2019

(54) METHOD AND APPARATUS FOR BIPOLAR MEMORY WRITE-VERIFY

(71) Applicant: SPIN TRANSFER TECHNOLOGIES, INC., Fremont, CA (US)

(72) Inventors: Neal Berger, Cupertino, CA (US); Ben Louie, Fremont, CA (US); Mourad El-Baraji, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/691,577

(22) Filed: Aug. 30, 2017

(65) Prior Publication Data

US 2017/0365317 A1    Dec. 21, 2017

Related U.S. Application Data

(63) Continuation of application No. 15/174,482, filed on Jun. 6, 2016.
(Continued)

(51) Int. Cl.
| | | |
|---|---|---|
| *G11C 11/00* | (2006.01) | |
| *G11C 11/16* | (2006.01) | |
| *G11C 11/15* | (2006.01) | |

(52) U.S. Cl.
CPC ........ *G11C 11/1677* (2013.01); *G11C 11/161* (2013.01); *G11C 11/1655* (2013.01);
(Continued)

(58) Field of Classification Search
CPC .......... G11C 11/16; G11C 11/15; H01L 43/08
(Continued)

(56) References Cited

U.S. PATENT DOCUMENTS

| 4,597,487 A | 7/1986 | Crosby et al. |
|---|---|---|
| 5,541,868 A | 7/1996 | Prinz |

(Continued)

FOREIGN PATENT DOCUMENTS

| CA | 2766141 | 1/2011 |
|---|---|---|
| CA | 2766141 A1 | 1/2011 |

(Continued)

OTHER PUBLICATIONS

US 2016/0218273 A1, 07/2016, Pinarbasi (withdrawn)
(Continued)

*Primary Examiner* — Connie C Yoha

(57) ABSTRACT

An advantageous write verify operation for bipolar memory devices is disclosed. The verify operation is performed under the same bias conditions as the write operation. Thus, the verify operation reduces disturb conditions caused when verify operation is performed in opposite bias to write operation. The advantageous write verify operation may be performed with control logic on source and bit lines. In another embodiment, the advantageous write operation is performed with mux coupled to control logic. The mux determines whether verify (0) or verify (1) operation should be performed based on data in a program latch. Moreover, the mux may select bias conditions for read operations based on a register bit. Trim circuits optionally provide guard banding and modify reference voltages for verify operations performed in opposite polarity to normal read operation.

21 Claims, 7 Drawing Sheets

Related U.S. Application Data

(60) Provisional application No. 62/205,178, filed on Aug. 14, 2015.

(52) U.S. Cl.
CPC ...... *G11C 11/1659* (2013.01); *G11C 11/1673* (2013.01); *G11C 11/1675* (2013.01); *G11C 11/15* (2013.01); *G11C 11/16* (2013.01)

(58) Field of Classification Search
USPC ............................ 365/157, 148, 158, 185.22
See application file for complete search history.

(56) References Cited

U.S. PATENT DOCUMENTS

| | | |
|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,321 B1 | 1/2005 | Estakhri |
| 6,842,317 B2 | 1/2005 | Sugita et al. |
| 6,842,366 B2 | 1/2005 | Tanizaki et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,262,941 B2 | 8/2007 | Li et al. |
| 7,273,780 B2 | 9/2007 | Kim |
| 7,307,876 B2 | 12/2007 | Kent et al. |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura et al. |
| 7,476,919 B2 | 1/2009 | Hong et al. |
| 7,502,249 B1 | 3/2009 | Ding |
| 7,515,485 B2 | 4/2009 | Lee |
| 7,541,117 B2 | 6/2009 | Ogawa |
| 7,573,737 B2 | 8/2009 | Kent et al. |
| 7,582,166 B2 | 9/2009 | Lampe |
| 7,598,555 B1 | 10/2009 | Ding |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,675,792 B2 | 3/2010 | Bedeschi |
| 7,696,551 B2 | 4/2010 | Xiao |
| 7,733,699 B2 * | 6/2010 | Roohparvar ...... G11C 16/0483 365/185.17 |
| 7,739,559 B2 | 6/2010 | Suzuki et al. |
| 7,773,439 B2 | 8/2010 | Do et al. |
| 7,776,665 B2 | 8/2010 | Izumi et al. |
| 7,810,017 B2 | 10/2010 | Radke |
| 7,852,662 B2 | 12/2010 | Yang |
| 7,861,141 B2 | 12/2010 | Chen |
| 7,881,095 B2 | 2/2011 | Lu et al. |
| 7,911,832 B2 | 3/2011 | Kent et al. |
| 7,936,595 B2 | 5/2011 | Han et al. |
| 7,983,077 B2 | 7/2011 | Park |
| 7,986,544 B2 | 7/2011 | Kent et al. |

(56) References Cited

U.S. PATENT DOCUMENTS

| | | |
|---|---|---|
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,363,465 B2 | 1/2013 | Kent et al. |
| 8,374,050 B2 | 2/2013 | Zhou et al. |
| 8,386,836 B2 | 2/2013 | Burger |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong at al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,705,279 B2 | 4/2014 | Kim |
| 8,716,817 B2 | 5/2014 | Saida |
| 8,722,543 B2 | 5/2014 | Belen |
| 8,737,137 B1 | 5/2014 | Choy et al. |
| 8,780,617 B2 | 7/2014 | Kang |
| 8,792,269 B1 | 7/2014 | Abedifard |
| 8,802,451 B2 | 8/2014 | Malmhall |
| 8,832,530 B2 | 9/2014 | Pangal et al. |
| 8,852,760 B2 | 10/2014 | Wang et al. |
| 8,862,808 B2 | 10/2014 | Tsukamoto et al. |
| 8,867,258 B2 | 10/2014 | Rao |
| 8,902,628 B2 | 12/2014 | Ha |
| 8,966,345 B2 | 2/2015 | Wilkerson |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,037,812 B2 | 5/2015 | Chew |
| 9,043,674 B2 | 5/2015 | Wu |
| 9,070,441 B2 | 6/2015 | Otsuka et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,229,806 B2 | 1/2016 | Mekhanik et al. |
| 9,229,853 B2 | 1/2016 | Khan |
| 9,245,608 B2 | 1/2016 | Chen et al. |
| 9,250,990 B2 | 2/2016 | Motwani |
| 9,250,997 B2 | 2/2016 | Kim et al. |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,337,412 B2 | 3/2016 | Pinarbasi et al. |
| 9,317,429 B2 | 4/2016 | Ramanujan |
| 9,324,457 B2 | 4/2016 | Takizawa |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee et al. |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,640,267 B2 | 5/2017 | Tani |
| 9,646,701 B2 | 5/2017 | Lee |
| 9,652,321 B2 | 5/2017 | Motwani |
| 9,697,140 B2 | 7/2017 | Kwok |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,853,006 B2 | 12/2017 | Arvin et al. |
| 9,853,292 B2 | 12/2017 | Loveridge et al. |
| 9,858,976 B2 | 1/2018 | Ikegami |
| 9,865,806 B2 | 1/2018 | Choi et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |

(56) References Cited

U.S. PATENT DOCUMENTS

| | | |
|---|---|---|
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2007/0285972 A1* | 12/2007 | Horii ............... G11C 11/16 365/148 |
| 2008/0049487 A1* | 2/2008 | Yoshimura ......... G11C 11/22 365/148 |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0181009 A1* | 7/2008 | Arai ............... G11C 11/5628 365/185.17 |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny |
| 2010/0080040 A1 | 4/2010 | Choi |
| 2010/0124091 A1 | 5/2010 | Cowburn |
| 2010/0162065 A1 | 6/2010 | Norman |
| 2010/0193891 A1 | 8/2010 | Wang et al. |
| 2010/0232206 A1 | 9/2010 | Li et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0075845 A1 | 3/2013 | Chen et al. |
| 2013/0244344 A1 | 9/2013 | Malmhall |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2014/0321196 A1 | 10/2014 | Ikeda et al. |
| 2015/0056368 A1 | 2/2015 | Wang et al. |
| 2015/0171316 A1 | 6/2015 | Park et al. |
| 2015/0279904 A1 | 10/2015 | Pinarbasi et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0148685 A1* | 5/2016 | Roy ............... G11C 13/0069 365/148 |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0283385 A1 | 9/2016 | Boyd et al. |
| 2016/0284762 A1 | 9/2016 | Wang et al. |
| 2016/0315118 A1 | 10/2016 | Kardasz et al. |
| 2016/0315259 A1 | 10/2016 | Fennimore et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0062712 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| CN | 105706259 | 6/2016 |
| CN | 105706259 A | 6/2016 |
| EP | 1345277 | 9/2003 |
| FR | 2817998 | 6/2002 |
| FR | 2817998 A1 | 6/2002 |
| FR | 2832542 | 5/2003 |
| FR | 2832542 A1 | 5/2003 |
| FR | 2910716 | 6/2008 |
| FR | 2910716 A1 | 6/2008 |
| JP | H10-004012 | 1/1998 |
| JP | H10-004012 A | 1/1998 |
| JP | H11-120758 | 4/1999 |
| JP | H11-120758 A | 4/1999 |
| JP | H11-352867 | 12/1999 |

(56) References Cited

FOREIGN PATENT DOCUMENTS

| | | |
|---|---|---|
| JP | H11-352867 A | 12/1999 |
| JP | 2001-195878 | 7/2001 |
| JP | 2001-195878 A | 7/2001 |
| JP | 2002-261352 | 9/2002 |
| JP | 2002-261352 A | 9/2002 |
| JP | 2002-357489 | 12/2002 |
| JP | 2002-357489 A | 12/2002 |
| JP | 2003-318461 | 11/2003 |
| JP | 2003-318461 A | 11/2003 |
| JP | 2005-044848 | 2/2005 |
| JP | 2005-150482 | 6/2005 |
| JP | 2005-150482 A | 6/2005 |
| JP | 2005-535111 | 11/2005 |
| JP | 2006-128579 A | 11/2005 |
| JP | 2006-128579 A | 5/2006 |
| JP | 2006128579 | 5/2006 |
| JP | 2008-524830 | 7/2008 |
| JP | 2008-524830 A | 7/2008 |
| JP | 2009-027177 | 2/2009 |
| JP | 2009-027177 A | 2/2009 |
| JP | 2013-012546 | 1/2013 |
| JP | 2013-012546 A | 1/2013 |
| JP | 2014-039061 | 2/2014 |
| JP | 2014-039061 A | 2/2014 |
| JP | 5635666 | 12/2014 |
| JP | 5635666 B2 | 12/2014 |
| JP | 2015-002352 | 1/2015 |
| JP | 2015-002352 A | 1/2015 |
| KR | 10-2014-015246 | 9/2014 |
| KR | 10-2014-0115246 A | 9/2014 |
| WO | 2009-080636 | 7/2009 |
| WO | 2009-080636 A1 | 7/2009 |
| WO | 2011-005484 | 1/2011 |
| WO | 2011-005484 A2 | 1/2011 |
| WO | 2014-062681 | 4/2014 |
| WO | 2015-153142 A1 | 10/2015 |
| WO | 2016-014326 A1 | 1/2016 |
| WO | 2016-048603 A1 | 3/2016 |
| WO | 2016171920 A1 | 10/2016 |
| WO | 2016181800 A1 | 10/2016 |
| WO | 2016204835 A1 | 12/2016 |
| WO | 2017019134 A1 | 2/2017 |
| WO | 2017030647 A1 | 2/2017 |

OTHER PUBLICATIONS

US 7,026,672, 04/2006, Grandis, Inc. (withdrawn)
International Search Report and Written Opinion dated Apr. 7, 2017 in PCT/US2016/067444; 13 pages. (reference provided in parent application. U.S. Pat. No. 10,163,479).
Notice of Allowance dated Apr. 21, 2017 in U.S. Appl. No. 15/157,783; 36 pp. (reference provided in parent application. U.S. Pat. No. 10,163,479).
S. Ikeda, et al.; "A perpindicular-aisotropy Co FeB—MgO magnetic tunnel junction"; Nature Materials, vol. 9, Sep. 2010; pp. 721-724 (4 pages) (reference provided in parent application. U.S. Pat. No. 10,163,479).
Pinarbasi, et al.; U.S. Appl. No. 15/445,260, filed Feb. 28, 2017, entitled Precessional Spin Current Structure for MRAM (reference provided in parent application. U.S. Pat. No. 10,163,479).
Pinarbasi, et al.; US Patent Application No. 151445,362, filed Feb. 28, 2017, entitled Precessional Spin current Structure for MRAM (reference provided in parent application. U.S. Pat. No. 10,163,479).
NonFinal Office Action dated Jan. 20, 2016 in U.S. Appl. No. 14/242,419; 17 pages (reference provided in parent application. U.S. Pat. No. 10,163,479).
Final Office Action dated Jul. 9, 2015 in U.S. Appl. No. 14/242,419; 19 pages (reference provided in parent application. U.S. Pat. No. 10,163,479).
NonFinal Office Action dated Mar. 20, 2015 in U.S. Appl. No. 14/242,419; 18 pages (reference provided in parent application. U.S. Pat. No. 10,163,479).
NonFinal Office Action dated Sep. 11, 2015 in U.S. Appl. No. 14/492,943; 13 pages (reference provided in parent application. U.S. Pat. No. 10,163,479).
NonFinal Office Action dated Feb. 6, 2017 in U.S. Appl. No. 14/814,036; 22 pages (reference provided in parent application. U.S. Pat. No. 10,163,479).
NonFinal Office Action dated Dec. 9, 2017 in U.S. Appl. No. 141866,359; 26 pages (reference provided in parent application. U.S. Pat. No. 10,163,479).
NonFinal Office Action dated Jan. 25, 2017 in U.S. Appl. No. 15/097,576; 17 pages (reference provided in parent application. U.S. Pat. No. 10,163,479).
NonFinal Office Action dated Dec. 23, 2016 in U.S. Appl. No. 15/093,367; 13 pages (reference provided in parent application. U.S. Pat. No. 10,163,479).
R.H. Koch, et al., "Thermally Assisted Magnetization Reversal in Submicron-Sized Magnetic Thin Films", Physical Review Letters; The American Physical Society; vol. 84, No. 23; Jun. 5, 2000, pp/ 5419-5422 (4 pages) (reference provided in parent application. U.S. Pat. No. 10,163,479).
C.J. Lee, et al., "Analytica investigation of spin-transfer dynamics using a perpindicular-to-plane polarizer"; Applied Physics Letters; American Institute of Physics; vol. 86, (2005); pp. 022505-1-022505-3 (3 pages) (reference provided in parent application. U.S. Pat. No. 10,163,479).
Kirsten Martens, et al., "Thermally Induced Magnetic Switching in Thin Ferromagnetic Annuli"; NSF grants PHY-0351964 (DLS); 2005; 11 pages (reference provided in parent application. U.S. Pat. No. 10,163,479).
Kirsten Martens, et al.; "Magnetic Reversal in Nanoscopic Ferromagnetic Rings", NSF grants PHY-0351964 (DLS); 2006; 23 pages (reference provided in parent application. U.S. Pat. No. 10,163,479).
"Magentic Technology Sprintronics, Media and Interface", Data Storage Institute, R&D Highlights; Sep. 2010; 3 pages (reference provided in parent application. U.S. Pat. No. 10,163,479).
Andrew Kent, et al.; U.S. Appl. No. 61/715,111, filed Oct. 17, 2012, entitled "Inverted Orthogonal Spin Transfer Layer Stack" (reference provided in parent application. U.S. Pat. No. 10,163,479).
International Search Report and Written Opinion dated Jul. 10, 2015 in PCT/US2015/021580; 12 pages (reference provided in parent application. U.S. Pat. No. 10,163,479).
Kardasz, et al.I U.S. Appl. No. 14/866,359, filed Sep. 25, 2015, entitled Spin Transfer Torque Structure for MRAM Devices Having a Spin Injection Capping Layer: (reference provided in parent application. U.S. Pat. No. 10,163,479).
International Search Report and Written Opinion dated Oct. 30, 2015 in PCT/US2015/040700; 11 pages (reference provided in parent application. U.S. Pat. No. 10,163,479).
International Search Report and Written Opinion dated Dec. 14, 2015 in PCT/US2015/047875; 13 pages (reference provided in parent application. U.S. Pat. No. 10,163,479).
Kardasz, et al.; U.S. Appl. No. 15/091,853, filed Apr. 6, 2016, entitled "High Annealing Temperature Jerpendicular Magnetic Anisotropy Structure for Mangnetic Random Access Memory" (reference provided in parent application. U.S. Pat. No. 10,163,479).
Pinarbasi, et al.; U.S. Appl. No. 15/093,367, filed Apr. 7, 2016, entitled Magnetic Tunnel Junction Structure for MRAM Device (reference provided in parent application. U.S. Pat. No. 10,163,479).
Pinarbasi, et al.; U.S. Appl. No. 15/097,576, filed Apr. 13, 2016, entitled Polishing Stop Layer(s) for Processing Arrays of Semiconductor Elements (reference provided in parent application. U.S. Pat. No. 10,163,479).
Pinarbasi, et al.; U.S. Appl. No. 15/157,783, filed May 18, 2016, entitled "Memory Cell Having Magnetic Tunnel Junction and Thermal Stability Enhancement Layer" (reference provided in parent application. U.S. Pat. No. 10,163,479).
Berger, et al.; U.S. Appl. No. 15/174,482, filed Jun. 6, 2016, entitled "Method and Apparatus for Bipolar Memory Write-Verify" (reference provided in parent application. U.S. Pat. No. 10,163,479).
International Search Report and Written Opinion dated Jun. 17, 2016 in PCT/US2016/021324; 9 pages. (reference provided in parent application. U.S. Pat. No. 10,163,479).

(56) References Cited

OTHER PUBLICATIONS

International Search Report and Written Opinion dated Jun. 17, 2016 in PCT/US2013/021691; 9 pages. (reference provided in parent application. U.S. Pat. No. 10,163,479).

International Search Report and Written Opinion dated Jul. 15, 2016 in PCT/US2016/026473; 9 pages. (reference provided in parent application. U.S. Pat. No. 10,163,479).

International Search Report and Written Opinion dated Jul. 21, 2016 in PCT/US2016/027445; 10 pages. (reference provided in parent application. U.S. Pat. No. 10,163,479).

Pinarbasi, et al.; U.S. Appl. No. 14/814,036, filed Jul. 30, 2016, entitled "Precessional Spin Current Structure for MRAM". (reference provided in parent application. U.S. Pat. No. 10,163,479).

International Search Report and Written Opinion dated Sep. 28, 2016 in PCT/US2016/037843; 10 pages. (reference provided in parent application. U.S. Pat. No. 10,163,479).

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al, "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp. 022505-1-022505-3 (3 pages).

Kirsten Martens, et al "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2005, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

\* cited by examiner

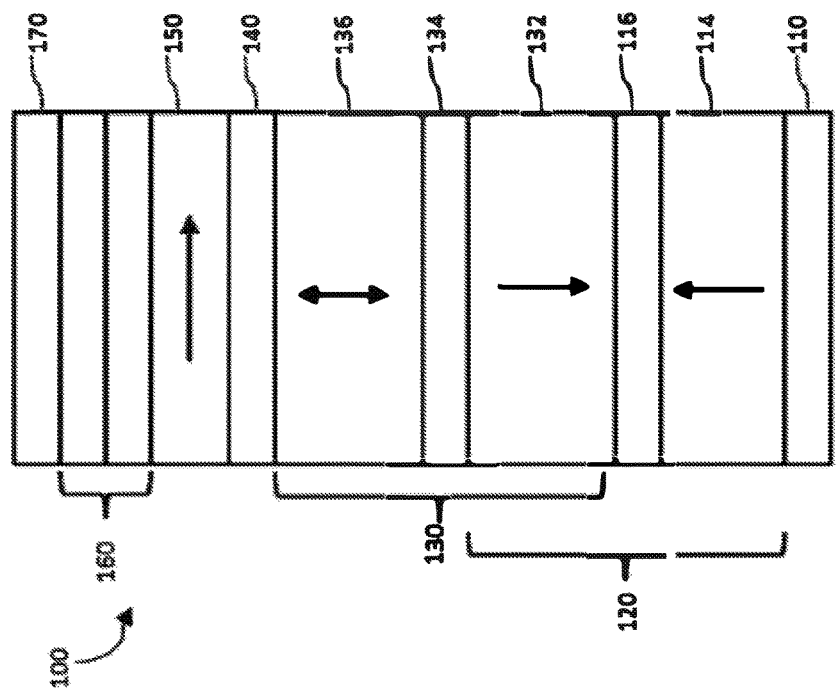

METHOD AND APPARATUS FOR BIPOLAR MEMORY WRITE-VERIFY

CROSS-REFERENCE TO RELATED APPLICATION

The present application is a Continuation of, claims the benefit of and priority to U.S. application Ser. No. 15/174,482, filed Jun. 6, 2016, entitled "METHODS AND APPARATUS FOR BIPOLAR MEMORY WRITE-VERIFY" and hereby incorporated by reference in its entirety, which claims priority from U.S. Provisional Application Application No. 62/205,178, filed Aug. 14, 2015. Priority to this provisional application is expressly claimed, and the disclosure of the provisional application is hereby incorporated herein by reference in its entirety.

FIELD

The present patent document relates generally to random access memory (RAM). More particularly, the present patent document relates to write-verify operations in RAM comprising bipolar memory elements. The methods and devices described herein are particularly useful in spin-transfer torque magnetic memory (STT-MRAM) devices.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction ("MTJ"). In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices. Spin transfer torque magnetic random access memory ("STT-MRAM") or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

STT-MRAM devices belong to a class of devices relying on bipolar memory elements. Bipolar memory elements use currents to "write" data to a memory element. Depending on the direction of current flow, a logic high (1) or logic low (0) bit may be written to the memory element. Such bipolar memory devices may include MRAM, resistive random-access memory (RRAM), phase-change memory (PCM), among others. For example, RRAM devices may utilize memristors as a memory element. Current flowing in one direction may be used to write a logic (1) to the memristor. Current flowing in the opposite direction may be used to write a logic (0) to the memristor.

A typical MRAM device with a polarizer layer and an MTJ is shown in FIG. 1. FIG. 1 illustrates perpendicular magnetic tunnel junction ("MTJ") stack 100 for a conventional STT-MRAM device. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has a antiferromagnetic coupling layer 116 disposed over the first magnetic layer 114. Furthermore, a nonmagnetic spacer 140 is disposed on top of MTJ 130 and an optional polarizer 150 is disposed on top of the nonmagnetic spacer 140. Polarizer 150 is a magnetic layer that in an embodiment has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Note that in other embodiments, polarizer 150, if present, can also have a magnetic direction perpendicular to its plane, just as the reference layer 132 and free layer 136. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

The resistance of the magnetic memory device is sensitive to the relative orientation of the magnetization vector of the free magnetic layer and the magnetization vector of the reference layer. The resistance of the magnetic memory device is highest when the magnetization vectors of the free magnetic layer and the reference layer, respectively, are in anti-parallel alignment. The resistance of the magnetic device is lowest when the magnetization vectors of the layers free magnetic layer and the reference layer, respectively, are in parallel alignment. Thus, a resistance measurement or its equivalent can determine the orientation of the magnetization vector of the free magnetic layer.

In an MRAM memory write operation, a verify operation can be used to check if a write operation has completed successfully and that the correct data has been written. Typically, a verify operation is performed in a similar fashion to a read operation. For example, a read could be implemented with a bias condition where the bit line is driven to a high potential, while the source line is driven to a low potential to generate current across the MTJ so that the resistance measurement can be made. A verify operation may also be implemented in other bipolar memory elements including RRAM and PCM among others.

In these devices, data is stored in program latches during both write and verify operations. Data stored in the latches (write buffer) determines the voltage condition on bit lines during write operations. In write operations, bit line and source line bias are dependent on the data stored. For example, if the data to be written is logic zero (0), the bit line can be driven high while the source line is driven low. If the data to be written is logic one (1), the opposite bias condition would need to exist in order to reverse the polarity of current flow across the MTJ. In this case for writing logic one (1), the source line would be driven high while the bit line would be driven low.

During either read or verify operations, the bit line is usually at a high voltage (but at a lower voltage than during a write operation) while the source line is at a low voltage, generally close to zero volts. Normally, a write verify operation can be implemented in a similar manner to a read operation. However, the operation presented above can result in what is known as a disturb condition, which occurs when a verify operation is performed after a write logic one (1) operation. In this case, the memory bit is written with the source being driven to a high voltage while the bit line is driven to a low voltage. Thus, during a verify operation, the data would be read with the opposite polarity of the bit line and source line than would normally be done during a read operation. Prior circuitry used for write, read, and verify operations is shown in FIGS. 2A and 2B.

FIG. 2A shows operation of exemplary bipolar memory device 200, in this case, an MRAM device, during write (0), verify, and read operations. Bipolar memory device 200 includes memory cell 202 coupled to source line 208 and bit line 210. Memory cell 202 comprises MTJ 204 and select transistor 206. Select transistor is further coupled to word line 212. MTJ 204 is coupled to bit line 210 and select transistor 206 is coupled to source line 208. One of ordinary skill in the art will understand that the opposite configuration is also possible. That is MTJ 204 could be coupled to source line 208 and select transistor 206 could be coupled to bit line 210.

During write (0), verify, and read operations, voltage node 214 on source line is driven low while voltage node 216 on bit line is driven high. The opposite bias conditions may also be applied for write (0), verify, and read operations and are dependent simply on naming convention for write (0). The reader will also appreciate that verify and read operations occur with the same bias conditions. Voltage node 214 may be driven to ground or otherwise held close to 0V. Voltage node 216 may be driven to a positive voltage. Voltage node 216 is driven to for example, 1.0 V for verify operations; 1.2 V for read operations; and a higher voltage for write operations. Voltage is applied to word line 212 to activate select transistor 206 to allow current i to flow between bit line and source line.

During write (0) operation, the voltage differential across memory cell 202 causes current i to flow. Current i causes the magnetization of free layer of MTJ 204 to align, or become parallel, with the reference layer of MTJ 204. During verify and read operation, the current i is not sufficient to alter the state of free layer and the bit stored in MTJ 204 may be ascertained.

FIG. 2B shows operation of exemplary bipolar memory device 250, in this example, an MRAM device, during write (1) operation. Bipolar memory device 250 includes memory cell 252 coupled to source line 258 and bit line 260. Memory cell 252 comprises MTJ 254 and select transistor 256. Select transistor is further coupled to word line 262. MTJ 254 is coupled to bit line 260 and select transistor 256 is coupled to source line 258. One or ordinary skill in the art will understand that the opposite configuration is also possible. That is MTJ 254 could be coupled to source line 258 and select transistor 256 could be coupled to bit line 260.

Bipolar memory device 250 of FIG. 2B is identical to bipolar memory device 200 of FIG. 2A except that polarity of voltages on source and bit lines are flipped. Thus, voltage node 264 on source line 258 is driven high and voltage node 266 bit line 260 is driven low. Voltage node 264 may also be at a slightly higher voltage for write (1) operation than corresponding voltage on the bit line during write (0) operation. This is because the voltage drop across select transistor 256 is higher in this configuration. Moreover, voltage on word line 262 is chosen to enable current flow. This opposite bias conditions causes current i to flow in the opposite direction from bipolar memory device 200 of FIG. 2A. This results in write (1) operation.

However, performing a write (1) operation as shown in FIG. 2B and then verify operation as shown in FIG. 2A results in disturb condition. This is because opposite bias voltages are applied to source and bit lines for write (1) and verify operations.

Thus, advantageous write-verify operation is necessary to reduce disturb conditions when verifying data bits in bipolar memory devices.

SUMMARY

Exemplary embodiments of the present disclosure are directed to advantageous write verify operations in bipolar memory devices. Moreover, the present disclosure discloses a beneficial read operation.

An advantageous write verify operation for bipolar memory devices is disclosed. The verify operation is performed under the same bias conditions as the write operation. Thus, the verify operation reduces disturb conditions caused when verify operation is performed in opposite bias to write operation.

In one embodiment, the method comprises writing a data bit into a memory cell. The memory cell comprises a bipolar memory element and a select transistor. The memory cell is coupled between a bit line and a source line. The write operation is performed by applying a first voltage across the source line and bit line to supply a first current to write the data bit into the memory cell. The first voltage differential may comprise a first polarity if a logic high is to be written to the memory cell. The first voltage differential may be a second polarity if a logic low is to be written to the memory cell.

The method may further comprise verifying the data bit written to the memory cell by applying a second voltage across the memory cell. The second voltage differential may be the first polarity if a logic high was written. Likewise, the second voltage differential may be the second polarity if a logic low was written.

In an embodiment, the first voltage differential may be applied using a first bias circuit couple to the source line and a second bias circuit coupled to the bit line. In an embodiment, the second voltage differential may likewise be applied with a first bias circuit coupled to the source line and a second bias circuit coupled to the bit line. In another embodiment, the verify operation may detect a logic level corresponding to the data bit in the bipolar memory element using a sense amplifier coupled to the source line. In another embodiment, the verify operation may detect a logic level corresponding to the data bit in the bipolar memory element using a sense amplifier coupled to the bit line. In another embodiment, the second voltage differential may applied by trimming a voltage applied when applying the second voltage differential. The second voltage differential being of opposite polarity to a voltage differential applied during a read operation.

In another embodiment, bias circuits coupled to a mux may apply the first voltage differential. The mux may be coupled to the source line and the bit line. The mux may select whether to drive the voltage high on the source line or the bit line based on data in a program latch. In another embodiment, bias circuits coupled to a mux may apply the second voltage differential. The mux may be coupled to the source line and the bit line. The mux may select whether to drive the voltage high on the source line or the bit line based on data in a program latch.

In another embodiment, an advantageous read operation is disclosed. The read operation may comprise reading a data bit written into the memory cell by applying a second voltage differential. The read operation may be performed by selecting whether to drive the source line or the bit line high based on a register bit in a mux coupled to the source line and the bit line. In an embodiment, the source line is selected to be driven high to perform the read operation. In another embodiment, the bit line is selected to be driven high to perform the read operation.

In embodiments, the bipolar memory element may comprise a magnetic tunnel junction, a perpendicular magnetic tunnel junction, a memristor, or chalcogenide glass.

The advantageous write verify operation may be performed with control logic on source and bit lines. In another embodiment, the advantageous write operation is performed with a multiplexer (mux) coupled to control logic. The mux determines whether verify (0) or verify (1) operation should be performed based on data in a program latch. Moreover, the mux may select bias conditions for read operations based on a register bit. Trim circuits optionally provide guard banding and modify reference voltages for verify operations performed in opposite polarity to normal read operation.

The present disclosure performs a verify operation for a bipolar memory device under the same bias conditions as a write operation. Thus, if a write (0) operation is performed with bit line high and source line low, the verify (0) operation is also performed with bit line high and source line low. Likewise, if a write (1) operation is performed with bit line low and source line high, the verify (1) operation may be also performed with bit line low and source line high. This is different compared to past verify operations that were performed under one bias condition, for example, with bit line high and source line low. If that was the case, the verify (1) operation was performed in opposite bias to the write (1) operation which resulted in a disturb condition.

Moreover, the present disclosure performs the verify operations utilizing several exemplary bipolar memory devices. In one embodiment, control of logic levels place on the source and bit lines can be implemented by coupling one or more bias circuits to each of the source and bit lines, respectively. In an alternative embodiment, the control of the logic levels placed on the source and bit lines can be implemented with bias circuits coupled to a mux. In an alternative embodiment, the bias circuits may be themselves be integrated into the sense amplifier.

In an embodiment, trimming circuits compensate for the fact that verify (1) operation, for example, is performed in opposite bias condition to a read operation. Because voltage drop across the transistor may be different depending upon the read/verify bias, trimming circuits may adjust the voltage as needed.

Because verify operations are performed similar to read operation, in an embodiment, the mux may select the direction of read operation based on a register bit. If read operation should be performed in verify (0) direction a register bit can determine that source line should be driven low while bit line should be driven high. If read operation should be performed in verify (1) direction a register bit can determine that source line should be driven high while bit line should be driven high.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

FIG. 1 shows exemplary perpendicular magnetic tunnel junction stack (MTJ) 100.

DETAILED DESCRIPTION

The following description is presented to enable any person skilled in the art to create and use a bipolar memory devices with an advantageous write verify operation. Each of the features and teachings disclosed herein can be utilized separately or in conjunction with other features to implement the disclosed apparatus and method. Representative examples utilizing many of these additional features and teachings, both separately and in combination, are described in further detail with reference to the attached drawings.

This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings. The features and advantages of the present disclosure are taught through exemplary STT-MRAM devices. However, one of ordinary skill in the art will understand that the teachings of the present disclosure apply to other bipolar memory elements including MRAM, RRAM, PCM, and RAM using other bipolar memory elements.

Figure 2A:
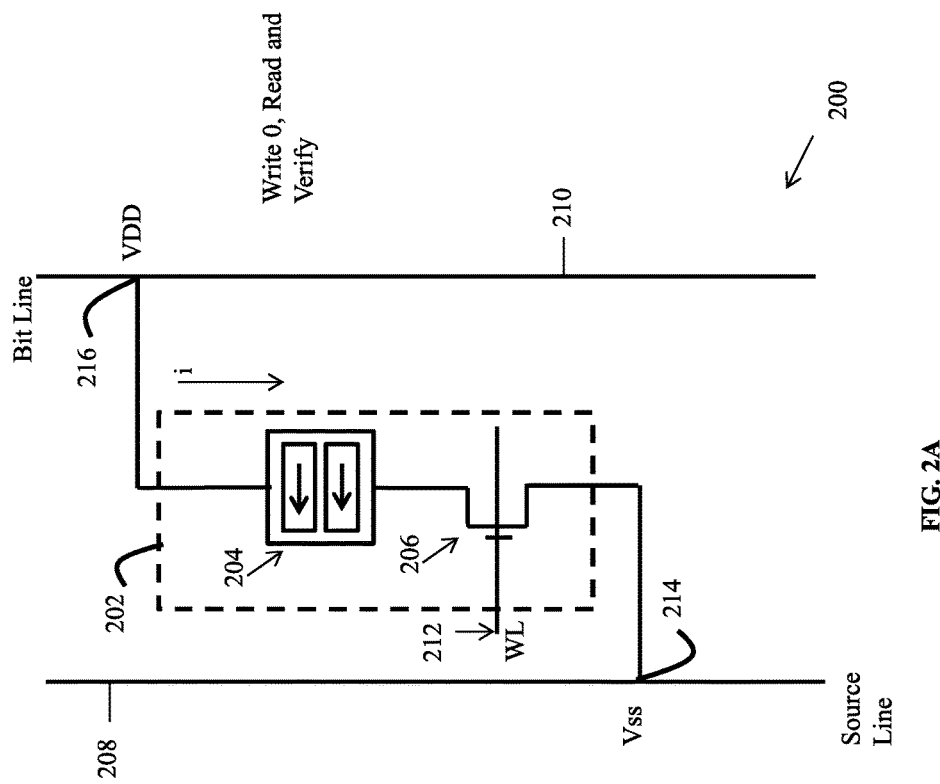
FIG. 2A shows operation of exemplary bipolar memory device 200 during write (0), read, and verify operation.
Figure 2B:
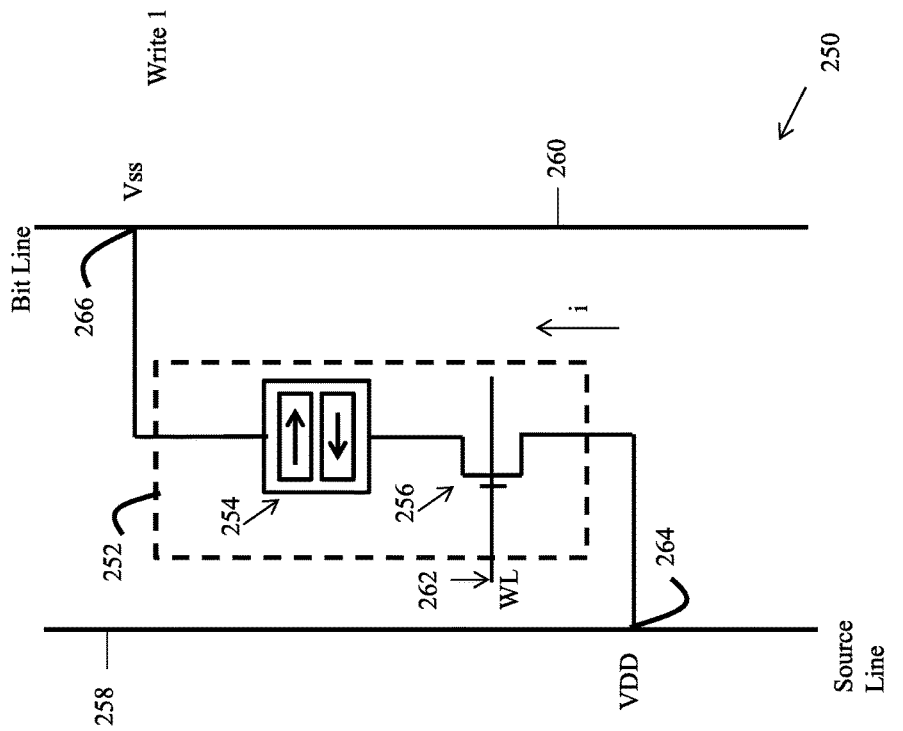
FIG. 2B shows operation of exemplary bipolar memory device 250 during write (1) operation.
Figure 3A:
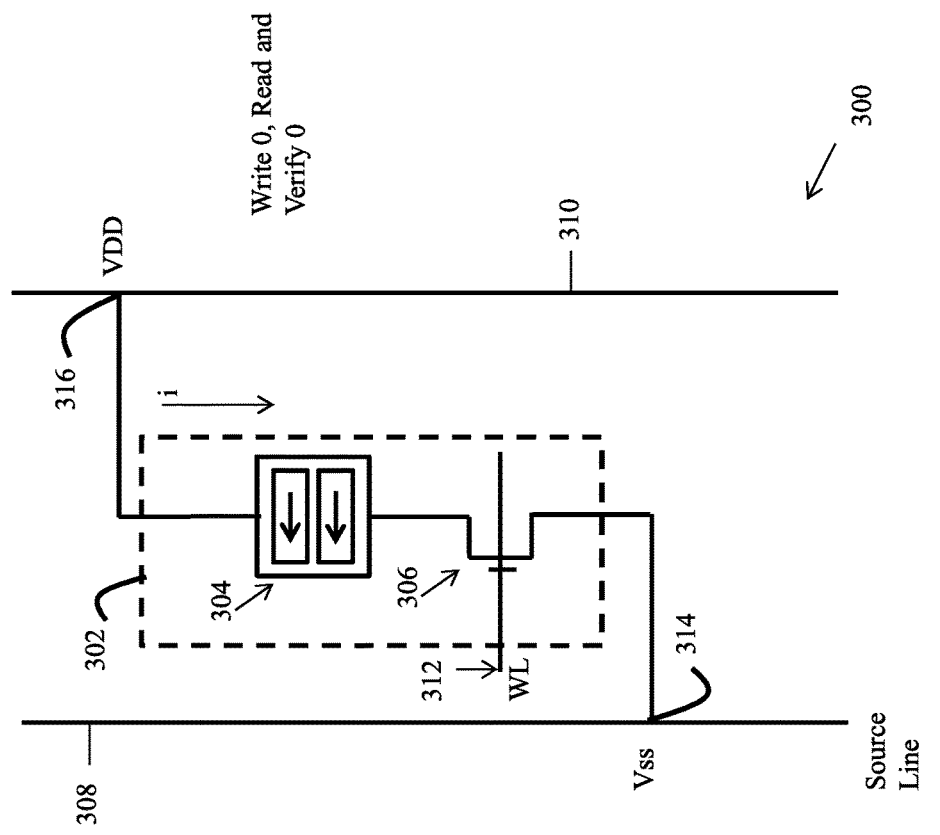
FIG. 3A shows operation of exemplary bipolar memory device 300 during write (0), read, and verify (0) operation.
Figure 3B:
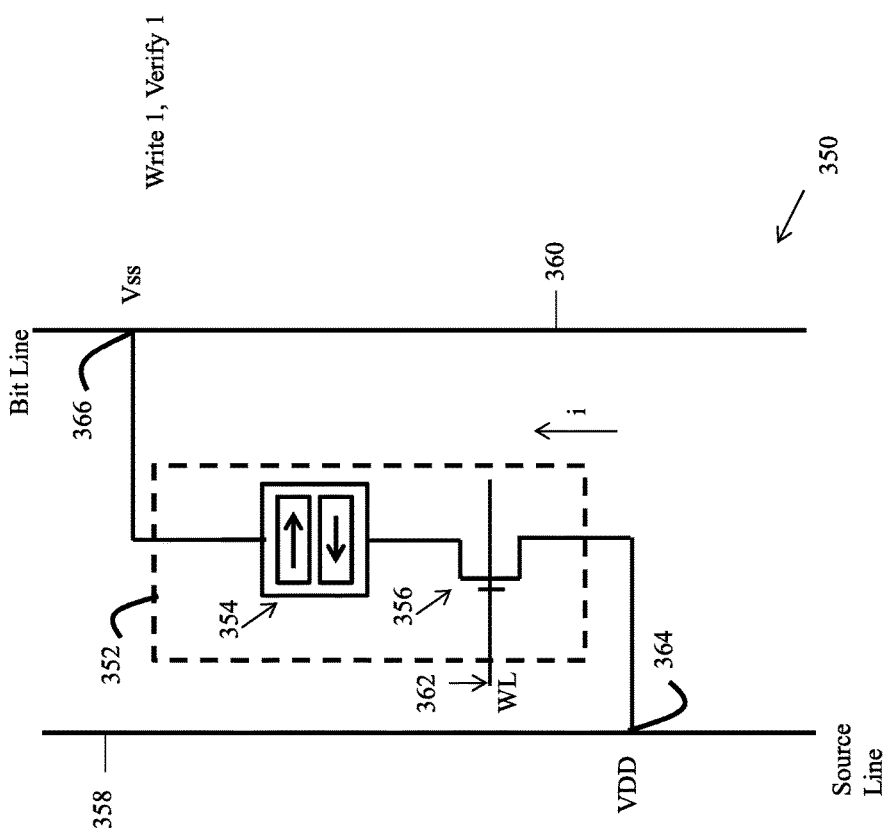
FIG. 3B shows operation of exemplary bipolar memory device 350 during write (1) and verify (1) operation.

FIGS. 3A and 3B show bipolar memory devices 300 and 350 utilizing the advantageous write verify operation of the present disclosure. Note that FIGS. 3A-3B, 4 and 5 shown an in-plane MTJ where the magnetic direction of the free and reference layers are in the plane of the layers). The embodiments described herein are equally applicable to perpendicular MTJs (where the magnetic direction of the free and reference layers are out of the plane of the layers). The present disclosure enables a verify operation to occur in the same bias condition as a write operation. Thus, verify (0) occurs using the same bias conditions as write (0). Verify (1) likewise occurs in the same bias conditions as write (1). Bias conditions refer to the polarity of the voltage across a bipolar memory element rather than the value of the voltage. As will be explained in greater detail in the present disclosure, the absolute value of the voltage conditions may be different for write, verify and read operations.

Since data is known during a verify operation, a verify operation can be implemented with the same operational polarity as during the write operation. Doing so avoids disturb issues since the current flow is in the same direction for both write and verify operations. As is the case with a write operation, during a verify operation, the data (e.g., logic low (0) or logic high (1)) stored in the write latch/buffer will determine the bias condition (e.g., low voltage or high voltage on the source line and bit line). Note that the write latch/buffer is disposed adjacent to the memory array. There may or may not be decoding between the memory array and the write/latch buffer to reduce the total number of required write/latch buffers. In an alternative embodiment, write latch/buffer may be combined with the Sense Amplifier Block.

FIG. 3A shows operation of exemplary bipolar memory device 300 during write (0), verify (0), and read operations. Bipolar memory device 300 includes memory cell 302 coupled to source line 308 and bit line 310. Memory cell 302 comprises MTJ 304 and select transistor 306. Select transistor is further coupled to word line 312. MTJ 304 is coupled to bit line 310 and select transistor 306 is coupled to source line 308. One or ordinary skill in the art will understand that the opposite configuration is also possible. That is MTJ 304 could be coupled to source line 308 and select transistor 306 could be coupled to bit line 310.

During write (0), verify (0), and read operations, voltage node 314 on source line 308 is driven low while voltage node 316 on bit line 310 is driven high. The opposite bias conditions may also be applied for write (0), verify (0), and read operations and are dependent simply on naming convention for write (0). Voltage node 314 may be driven to ground or otherwise held close to 0V. Voltage node 316 may be driven to a positive voltage. Voltage node 316 is driven to, for example, 1.0 V for verify operations; 1.2 V for read operations; and a higher voltage for write operations. Note that verify operations are typically more stringent than read operations. This is to ensure that future read operations occur correctly. Thus, verify and read operations could also be completed at the same voltage, for example, 1.2 V. However, voltage for verify operation could be applied for less time, for example 18 ns, than is applied for read operations, for example, 20 ns. Alternatively read and verify could be performed at same voltage and timing, using different reference voltages for the two operations. Voltage is applied to word line 312 to activate select transistor 306 to allow current i to flow between bit line and source line.

Consistent with operation of exemplary bipolar memory device 350, during write (0) operation, current i causes the magnetization of free layer of MTJ 304 to align, or become parallel, with the reference layer of MTJ 304. One of ordinary skill in the art will understand that in other embodiments, current i could cause free layer of MTJ 304 to become anti-parallel with reference layer which would result in write (1) or (0) operation depending on naming conventions. During read operation, the current i is not sufficient to alter the state of free layer and the bit stored in MTJ 304 may be ascertained. Typically, verify voltage applied to voltage node 316 is lower than the voltage for read operation to ensure that future read operations are accurate. However, this may not necessarily be the case and verify voltage could be at the same voltage value as read voltage, but simply applied for a shorter time as discussed above.

In summary, when a logic low (0) is written, a high voltage will also be placed on the bit line and a low voltage will be placed on the source line. During the verify operation for this write operation, a high voltage will also be placed on the bit line while a low voltage will be placed on the source line.

FIG. 3B shows operation of exemplary bipolar memory device 350 during write (1) and verify (1) operations. Bipolar memory device 350 includes memory cell 352 coupled to source line 358 and bit line 360. Memory cell 352 comprises MTJ 354 and select transistor 356. Select transistor is further coupled to word line 362. MTJ 354 is coupled to bit line 360 and select transistor 306 is coupled to source line 308. One or ordinary skill in the art will understand that the opposite configuration is also possible. That is MTJ 354 could be coupled to source line 358 and select transistor 356 could be coupled to bit line 360.

Bipolar memory device 350 of FIG. 3B is identical to bipolar memory device 300 of FIG. 3A except that polarity of voltages of source and bit lines are flipped. Thus, voltage node 364 on source line 358 is driven high and voltage node 366 bit line 360 is driven low. Voltage node 364 may also be at a slightly higher voltage for write (1) operation than corresponding voltage on the bit line during write (0) operation. This is because of the voltage drop caused by select transistor 356. Voltage drop may also occur due to parasitic losses caused if bit line and source line were perpendicular (rather than parallel as shown in FIGS. 3A and 3B). Moreover, voltage across select transistor 362 is altered to enable current to flow. This opposite bias conditions causes current i to flow in the opposite direction from bipolar memory device 300 of FIG. 3A. This results in write (1) operation. Consistent with operation of exemplary bipolar memory device 350, during write (1) operation, current i causes the magnetization of free layer of MTJ 354 to become anti-parallel, with the reference layer of MTJ 304. One of ordinary skill in the art will understand that in other embodiments, current i could cause free layer of MTJ 354 to become parallel with reference layer which would result in write (1) or (0) operation depending on naming conventions. Verify (1) operation is also performed in the same bias conditions.

Unlike the situation where a logic low (0) is written, when a logic high (1) is written, low voltage was placed on the bit line and a high voltage was placed on the source line. During the verify operation for this write operation, unlike in past devices, a low voltage is also placed on the bit line while a low voltage is also placed on the source line. This is exactly the opposite of prior devices, and may provide for faster verify operations. Moreover, because write (1) and verify (1) operations are performed under the same polarity, such verify operations do not result in a disturb condition, since the bit line and source line does not need to change to opposite polarities when transitioning from a write operation to a verify operation. The bit line remains at a low voltage for both write and verify. Likewise, the source line remains at high voltage for both write and verify, although the voltage level itself should be lower than the voltage level on the source line during the write operation.

Figure 4:
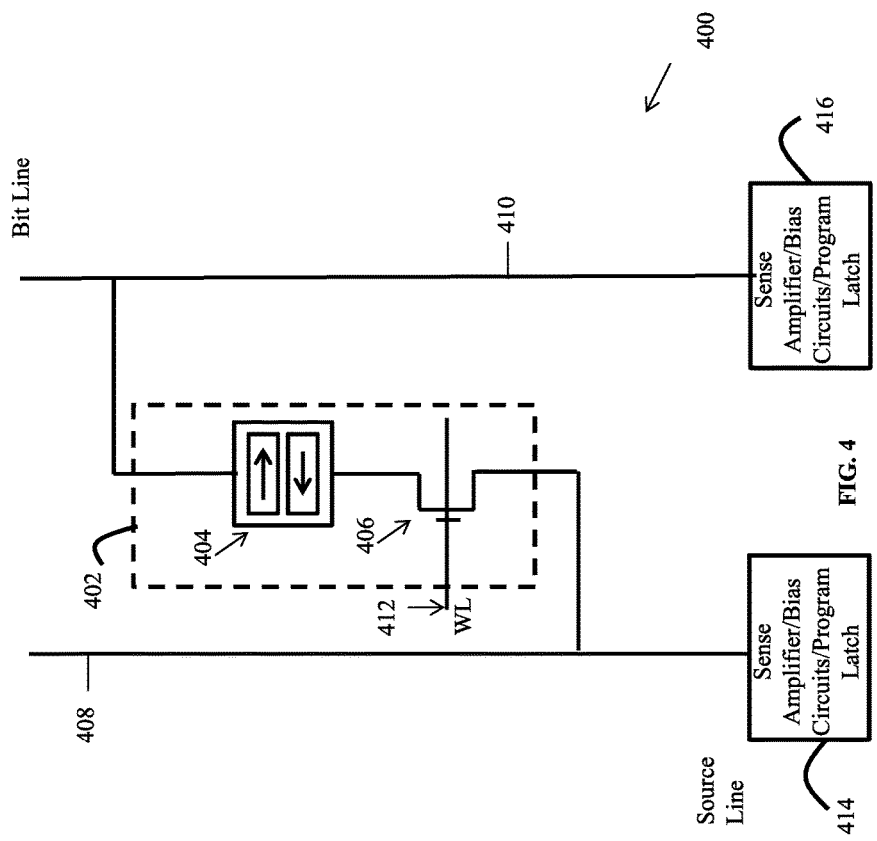
FIG. 4 shows exemplary bipolar memory device 400 having control logic.

FIG. 4 shows bipolar memory device 400. The basic operation of bipolar memory device 400 during read, write, and verify operations has already been discussed in connection with FIGS. 3A and 3B. The operation of the control logic used to perform the read, write, and verify operations will be discussed in the context of FIG. 4.

Bipolar memory device 400 further includes control logic 414 coupled to source line 408. Moreover, bipolar memory device 400 includes control logic 416 coupled to bit line 410. Control logic 414 and 416 may comprise sense amplifier, bias circuits and program latches. As can be seen in FIG. 4, control of the logic levels placed on the source line 410 and bit line 408 can be implemented by coupling one or more bias circuits to each of the source and bit lines, respectively.

During write operations, bias circuits coupled to bit line 408 and source line 410 drive the voltage on bit and source lines as described in FIGS. 3A and 3B. The configuration of bias circuits to drive voltages is known to those having ordinary skill in the art. Moreover, sense amplifiers coupled to source and bit lines may be used to ascertain the logic level written to MTJ 404 during read and verify operations.

During write and verify operations, program latch coupled to bias circuits may be used to determine the voltages to be placed on source and bit lines. That is program latch determines that logic high (1) should have been written to MTJ 404 during the previous write cycle. Bias circuits would then drive source line high and bit line low as described in FIG. 3B to perform write (1) and verify (1) operations.

Bias circuits may optionally include trim circuits. Trim circuits perform a variety of functions. First, during verify (0) operation, trim circuits may reduce the voltage or the time that the voltage is applied for verify operation. That is because verify operation should be performed more stringently than read operation. Thus, trim circuits perform guard banding functions during verify operation. Moreover, verify (1) operation occurs at an opposite polarity to read operation. Thus, trim circuits may flip the voltage as applied during normal read operation in order to perform verify (1) operation. Because verify (1) operation as described in FIG. 3A results in voltage drop across select transistor, trim circuitry may also increase the voltage on source line as compared to the voltage applied to bit line during verify (0) operation. Thus, trim circuits trim the voltages applied to source and bit lines as necessary to perform verify operations. Either sense amplifier 414 on source line 408 or sense amplifier 416 on bit line 410 may be then be used to determine the logic level written to MTJ 404.

Designers of bipolar memory devices also commonly adjust trim circuits during testing to ensure proper operation of bipolar memory devices in the field. Typically, trim circuits are adjusted for process variation and temperature effects (PVT) to ensure that source and bit lines are driven to proper voltages. Moreover, trim circuits may be adjusted so that currents through bipolar memory devices to not damage components of bipolar memory devices such as select transistors and bipolar memory elements. Thus, trim circuits may be used to increase yields of bipolar memory devices after fabrication of a bipolar memory device.

Figure 5:
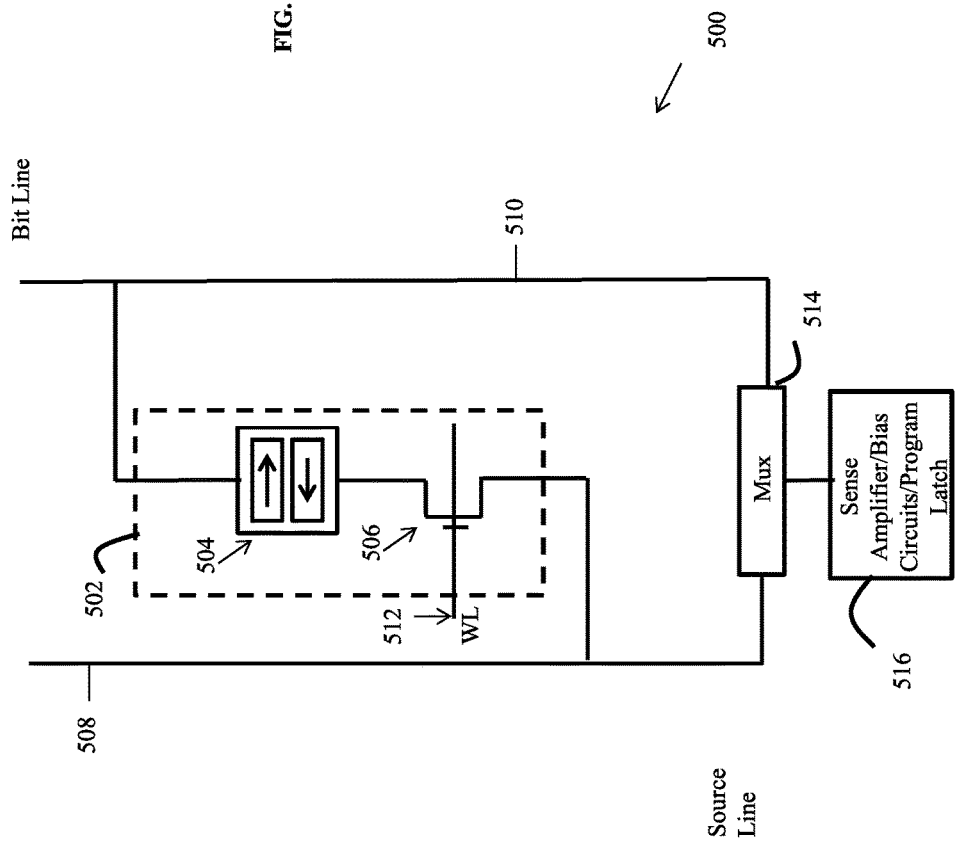
FIG. 5 shows alternate embodiment for exemplary bipolar memory device 500 having control logic and mux.

FIG. 5 shows an alternative embodiment for exemplary bipolar memory device 500. The basic operation of bipolar memory device 500 during read, write, and verify operations has already been discussed in connection with FIGS. 3A and 3B. The operation of control logic and mux for performing the read, write, and verify operations will be discussed in the context of FIG. 5.

Bipolar memory device 500 further includes mux 514 coupled to source line 508 and bit line 510. Moreover, bipolar memory device 500 includes control logic 516 coupled to mux 514. Control logic 516 may comprise sense amplifier, bias circuits and program latches.

Control of the logic levels placed on the source and bit lines can be implemented with a single sense amplifier that is multiplexed, as is shown in FIG. 5. The select input to Mux 514 is the value being written to the MTJ 504 during the write operation that was in the program latch. Thus, during write and verify operation, mux 514 selects whether bit line or source line should be driven high by bias circuits in control logic 516. Thus, for example bias circuits in control logic 516 cause bit line to be driven high during write (0) operation and source line to be driven high during write (1) operation.

As described in the context of the embodiment shown in FIG. 4, the device should compensate for the fact that verification of a write logic level high (1) operation will result in the bit and source lines having opposite polarity than what is used during a read operation. Such compensation can be implemented by offsetting the voltage/current reference during a verify logic level high (1) operation, for example via bias circuits having trim circuits. This allows for compensation for the logic levels on the bit and source lines during a normal read operation. The write verify operation for a logic level high (1) will need to pass through a transistor whereas a normal read operation the bit line is driven high and thus voltage is not lost across the transistor. Alternately this compensation can also be implemented by shifting or recentering the voltage/current reference window for a verification of both writing a logic level low (0) and a logic level high (1). This can be implemented by shifting both trip points of a logic level high and a logic level low during write verify operations.

Mux 514 may also be used to determine whether read operation should be performed by driving source line high or bit line high. As previously discussed, read operation is implemented similarly to verify operation. Thus, although described as performed with bit line high and source line low in FIG. 3A, read operation could also be performed with bit line low and source line high, similar to verify (1) operation of FIG. 3B. Mux 514 selects whether bit line or source line should be driven high based on a register bit. For example, if read operations are performed more accurately with source line high and bit line low, register bit could be set to enable bias circuits to drive source line high for read operations. Other considerations such as power and reliability may also be taken into account when setting register bit.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

We claim:

1. An apparatus for writing data to a memory device, the apparatus comprising:
 a memory cell coupled between a bit line and a source line, wherein the memory cell comprises a bipolar memory element and a select transistor;
 wherein the bipolar memory element is operable to be coupled to the bit line; and
 wherein the select transistor is operable to be coupled to the source line, and
 wherein further the memory cell is operable to store a data bit of a write operation into the bipolar memory element responsive to application of a first differential voltage across the bit line and the source line to supply a current to write the data bit into the memory cell, wherein the first differential voltage comprises a first polarity if the data bit is a logic high, and wherein the first voltage differential comprises a second polarity if the data bit is a logic low and
 wherein further the memory cell is operable to be read during a verification of the data bit responsive to an application of a second differential voltage across the bit line and the source line, wherein the second differential voltage is the first polarity if the data bit is a logic high, and wherein the second differential voltage is the second polarity if the data bit is a logic low.

2. The apparatus of claim 1, wherein the bipolar memory element is selected from a group consisting of: a memresistor, chalcogenide glass, and a magnetic tunnel junction.

3. The apparatus of claim 1, further comprising:
 a first bias circuit; and
 a second bias circuit, wherein the first bias circuit is coupled to the source line and wherein the second bias circuit is coupled to the bit line and are operable to apply the first voltage differential.

4. The apparatus of claim 1, further comprising:
 a first bias circuit; and
 a second bias circuit, wherein the first bias circuit is coupled to the source line and wherein the second bias circuit is coupled to the bit line and are operable to apply the second differential voltage.

5. The apparatus of claim 1, further comprising:
 a sense amplifier operable to detect a logic level corresponding to the data bit in the bipolar memory element prior to the verifying.

6. The apparatus of claim 1, further comprising:
 a trim circuit operable to reduce the second differential voltage during the verification.

7. The apparatus of claim 1, further comprising:
 a trim circuit operable to reduce an amount of time during which the second differential voltage is applied.

8. The apparatus of claim 7, wherein the second differential voltage is of opposite polarity to a voltage differential applied during a read operation.

9. The apparatus of claim 1, further comprising:
 a program latch;
 a multiplexer; and
 a bias circuit, wherein the bias circuit is coupled to the multiplexer, wherein the multiplexer is coupled to the source line and the bit line, wherein the first voltage differential is applied with the bias circuit, and wherein the multiplexer is operable to drive a polarity of the first voltage differential based on a value of data in the program latch.

10. The apparatus of claim 1, further comprising:
 a program latch;
 a multiplexer; and
 a bias circuit, wherein the bias circuit is coupled to the multiplexer, wherein the multiplexer is coupled to the source line and the bit line, wherein the second voltage differential is applied with the bias circuit, and wherein the multiplexer is operable to drive a polarity of the second voltage differential based on a value of data in the program latch.

11. The apparatus of claim 10, further comprising:
 a sense amplifier, wherein the sense amplifier is coupled to the multiplexer, and wherein the sense amplifier is operable to detect a logic level corresponding to the data bit in the bipolar memory element.

12. An apparatus for writing data to a spin-transfer torque magnetic memory (STT-MRAM) device, said apparatus comprising:
 a memory cell coupled between a bit line and a source line, wherein the memory cell comprises a bipolar memory element and a select transistor,
 wherein further the memory cell is operable to store a data bit of a write operation into the bipolar memory element responsive to application of a first differential voltage across the bit line and the source line to supply a current to write the data bit into the memory cell, wherein the first differential voltage comprises a first polarity if the data bit is a logic high, and wherein the first voltage differential comprises a second polarity if the data bit is a logic low, and
 wherein further the memory cell is operable to be read during a verification of the data bit responsive to an application of a second differential voltage across the bit line and the source line, wherein the second differential voltage is the first polarity if the data bit is a logic high, and wherein the second differential voltage is the second polarity if the data bit is a logic low.

13. The apparatus of claim 12, wherein the bipolar memory element operable to be coupled to the bit line, and wherein the select transistor operable to be coupled to the source line.

14. The apparatus of claim 12, wherein the bipolar memory element is selected from a group consisting of: a memresistor, chalcogenide glass, and a magnetic tunnel junction.

15. The apparatus of claim 13, further comprising:
 a first bias circuit; and
 a second bias circuit, wherein the first bias circuit is coupled to the source line and wherein the second bias circuit is coupled to the bit line and are operable to apply the first voltage differential.

16. The apparatus of claim 13, further comprising:
 a first bias circuit; and
 a second bias circuit, wherein the first bias circuit is coupled to the source line and wherein the second bias circuit is coupled to the bit line and are operable to apply the second differential voltage.

17. The apparatus of claim 12, further comprising:
a sense amplifier operable to detect a logic level corresponding to the data bit in the bipolar memory element prior to the verifying.

18. The apparatus of claim 12, further comprising:
a trim circuit operable to reduce the second differential voltage during the verifying.

19. The apparatus of claim 12, further comprising:
a trim circuit operable to reduce an amount of time during which the second differential voltage is applied during the verification.

20. An apparatus for writing data to a memory device, the apparatus comprising:
- a memory cell coupled between a bit line and a source line, wherein the memory cell comprises a bipolar memory element and a select transistor;
- the bipolar memory element operable to be coupled to the bit line; and
- the select transistor operable to be coupled to the source line,
- wherein writing a data bit into the bipolar memory element of the memory cell comprises:
  - applying a first differential voltage bias across the bit line and the source line provided the data bit is a first logic value; and
  - applying a second differential voltage bias across the bit line and source line provided the data bit is a second logic value, wherein the second differential voltage bias is opposite in polarity to the first differential voltage bias; and
- verifying the data bit of the memory cell, the verifying comprising:
  - reading the data bit of data from a latch; and
  - applying either the first or second differential voltage bias across the bit and the source line depending on the logic value of the data bit.

21. The apparatus of claim 20, wherein the applying of the verifying further comprises:
- applying the first differential voltage bias across the bit and the source line provided the data bit is the first logic value; and
- applying the second differential voltage bias across the bit and the source line provided the data bit is the second logic value.

* * * * *